United States Patent [19]

Brisson

[11] Patent Number: 4,718,100

[45] Date of Patent: Jan. 5, 1988

[54] HIGH CURRENT DEMAND CABLE

[76] Inventor: Bruce A. Brisson, 40391 Dolerita Ave., Fremont, Calif. 94539

[21] Appl. No.: 712,276

[22] Filed: Mar. 15, 1985

[51] Int. Cl.⁴ .............................................. H03F 1/26
[52] U.S. Cl. ........................................ 381/77; 381/97;
330/149; 330/192; 333/28 R
[58] Field of Search ................ 381/77, 97, 120, 111,
381/116, 117, 124; 179/77; 330/192; 333/28 R,
24 C, 23, 167, 236, 245, 169, 170

[56] References Cited

U.S. PATENT DOCUMENTS

| 767,818 | 8/1904 | Jacques | 333/28 R |
|---|---|---|---|
| 1,456,909 | 5/1923 | Pupin | 333/28 R |
| 1,570,215 | 1/1926 | Fry | 333/28 R |
| 1,709,037 | 4/1929 | Pero | 333/28 R |
| 1,711,653 | 5/1929 | Quarles | 333/28 R |
| 1,831,431 | 11/1931 | Wheeler | 333/28 R |
| 1,840,434 | 1/1932 | Cowan | 333/28 R |
| 2,158,978 | 5/1939 | Bowman-Manifold | 333/28 R |
| 2,163,750 | 6/1939 | D'Heedeng | 333/28 R |
| 3,631,270 | 12/1971 | Heinemann | 333/28 R |
| 3,649,769 | 3/1972 | Pest | 174/77 |
| 4,177,431 | 12/1979 | Polk, Jr. | 381/94 |
| 4,374,306 | 2/1983 | Lohr | 179/77 |

FOREIGN PATENT DOCUMENTS 53-140906  12/1978  Japan .................................. 179/77

*Primary Examiner*—Jin F. Ng
*Assistant Examiner*—L. C. Schroeder
*Attorney, Agent, or Firm*—Fliesler, Dubb, Meyer & Lovejoy

[57] ABSTRACT

Cabling (10) is provided for interconnecting amplifier (12) having a positive side (14) and a return side (16) to a load (18) having a positive side (20) and a return side (22). The cabling comprises a first open circuited conductor (24) having a first end (26) connected to a selected one of the amplifier positive side (14) and the amplifier return side (16) and having a second end (28) extending towards and terminating free from connection to the load (18). A second open circuited conductor (30) is provided which has a first end (32) connected to a respective one of the load positive side (20) and the load return side (22), said respective one being of a different polarity than the polarity of the selected one of the amplifier positive side (14) and amplifier return side (16) to which the first open circuited conductor (24) is connected and having a second end (34) extending towards and terminating free from connection to the amplifier (12). A first amplifier-load connecting structure (38) serves for electrically connecting the amplifier positive side (14) to the load positive side (20), the first connecting structure (38) being wound about at least a majority of the length of a selected one of the first and second open circuited conductors (24,30). A second amplifier-load connecting structure (40) serves for electrically connecting the amplifier return side (16) to the load return side (22), the second connecting structure (40) being wound about at least a majority of the length of a selected other of the first and second open circuited conductors (24,30). Improved sound results from use of such cabling.

14 Claims, 4 Drawing Figures

FIGURE 3
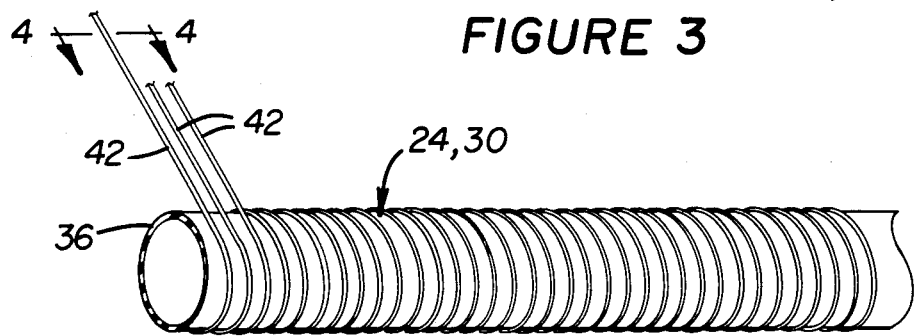
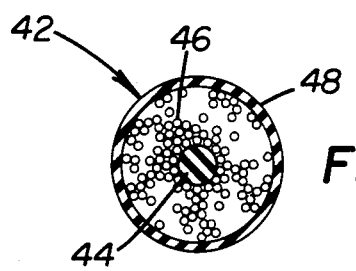
FIGURE 4
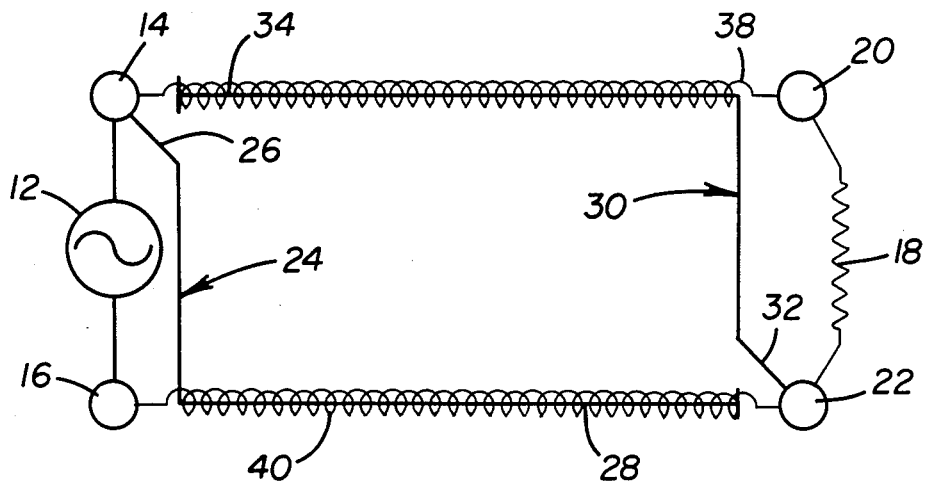
FIGURE 2

HIGH CURRENT DEMAND CABLE

TECHNICAL FIELD

This invention relates to cabling for interconnecting an amplifier having a positive side and a return side to a load having a positive side and a return side. More particularly, the invention relates to such cabling for use with an amplifier-speaker system.

BACKGROUND ART

The prior art teaches the use of very simple cables for interconnecting the positive side of an amplifier to the positive side of a speaker and the return side of the amplifier to the return side of the speaker. This has resulted in time misalignments between high frequency and low frequency sound components transmitted through such cable. The prior art has presented no solution to such a problem.

DISCLOSURE OF THE INVENTION

The present invention is directed to overcoming one or more of the problems as set forth above.

In accordance with an embodiment of the present invention cabling is provided for interconnecting an amplifier having a positive side and a return side to a load having a positive side and a return side. The cabling comprises a first open circuited conductor having a first end connected to a selected one of the amplifier positive side and the amplifier return side and having a second end extending towards and terminating free from connection to the load. A second open circuited conductor has a first end connected to a respective one of the load positive side and the load return side, the respective one being of a different polarity than the polarity of the selected one of the amplifier positive side and amplifier return side to which the first open circuited conductor is connected, and having a second end extending towards and terminating free from connection to the amplifier. First amplifier-load connecting means serve for electrically connecting the amplifier positive side to the load positive side. The first connecting means is wound about at least a portion of the length of a selected one of the first and second open circuited conductors. Second amplifier-load connecting means serve for electrically connecting the amplifier return side to the load return side. The second connecting means is wound about at least a portion of the length of a selected other of the first and second open circuited conductors.

In accordance with another embodiment of the invention cabling is provided for connecting an AC source to a load. The cabling includes first source-load connecting means for connecting the source and load positive sides and second such connecting means for connecting the source and load return sides. First capacitor means serve for creating capacitive coupling between a respective one of the source positive and return sides and a respective one of the load positive and return sides. Second capacitor means serves for creating capacitive coupling between a selected one of the load positive and return sides and a selected one of the source positive and return sides. The polarity of the selected one of the load positive and return sides is different than the polarity of the respective one of the source positive and return sides. Also, the polarity of the selected one of the source positive and return sides is of a different polarity than the polarity of the respective one of the load positive and return sides.

Cabling in accordance with the present invention corrects for time misalignments between high and low frequencies such as occur in prior art cabling.

BRIEF DESCRIPTION OF THE DRAWINGS

The invention will be better understood by reference to the accompanying drawings which form a part hereof wherein like numbers denote like parts and wherein:

FIG. 2 illustrates, schematically, another circuit in accordance with another embodiment of the present invention;

FIG. 3 illustrates a portion of a cable in accordance with an embodiment of the present invention; and FIG. 4 illustrates, in enlarged view, a detail in the cable shown in FIG. 3.

BEST MODE FOR CARRYING OUT THE INVENTION

Figure 1:
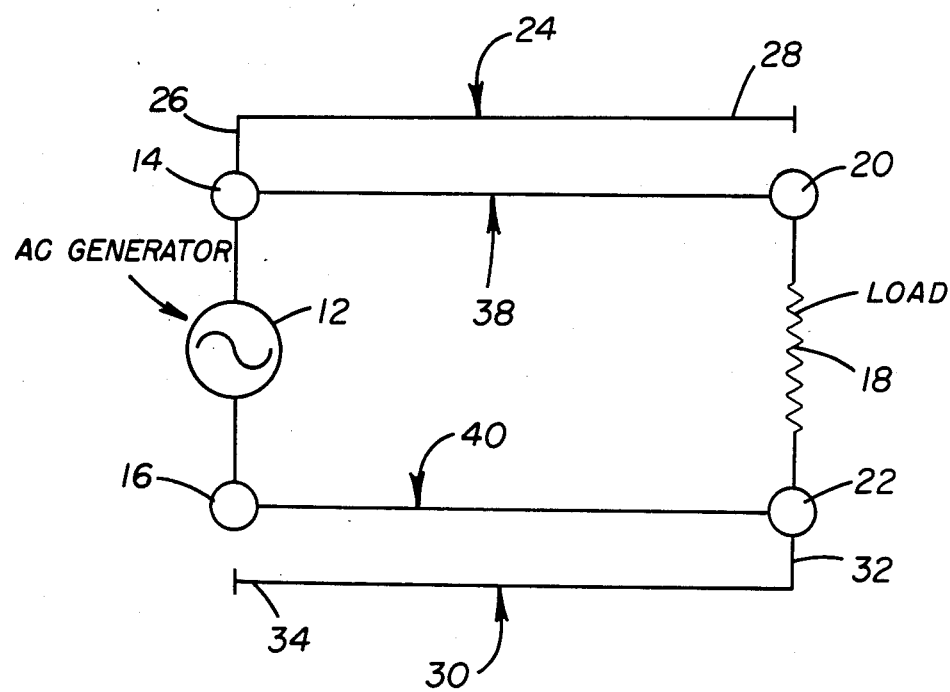
FIG. 1 illustrates, schematically, one circuit in accordance with an embodiment of the present invention.

As a cable sits at rest it can be viewed as a capacitor having some resistance. However, as an ever increasing voltage is applied to it, as the load decreases in value the current demands increase. As the current demands increase, the cable becomes more inductive (or more precisely the inductive difference, as a function of frequency of components of the signal, increases) and delays are set up within the cable between high and low frequencies. As the current demands increase and the inductance ratio (between high and low frequencies) goes up, so also does the impedance (which is characterized by the square root of L/C). This is not desirable in a low impedance system, such as amplifier to speaker interfaces which usually have impedances on the order of 8 to 16 ohms. In accordance with the present invention a noticeable sonic improvement is realized for signals having components over the entire audio frequency range, e.g., 20 Hertz to 20,000 Hertz, by providing cabling which leads to leading the voltage with the current.

FIG. 1 illustrates one embodiment of cabling 10 in accordance with the present invention. The cabling 10 serves for connecting an AC source (signal generator or amplifier) 12 having a first side 14 and a second side 16 to a load 18 having a first side 20 and a second side 22. In the embodiment illustrated in FIG. 1 the first side 14 may be a positive or return side of the amplifier 12. If the first side 14 is a positive side of the amplifier 12 then the first side 20 of the load 18 could be a positive side of the load 18. The pluralities of the sides 16 and 22 will likewise be the same, either positive or return.

In accordance with the present invention a first open circuited conductor 24 has a first end 26 connected to a selected one of the amplifier positive side and the amplifier return side. For the sake of discussion it will be assumed that the amplifier positive side is the side 14 and the amplifier return side is the side 16 although, as is discussed below, the polarities may be reversed. The first open circuited conductor 24 also has a second end 28 which extends towards and terminates frequent connection to the load 18.

A second open circuited conductor 30 has a first end 32 connected to a respective one of the load positive side and the load return side (for the sake of clarity the side 20 will be considered the positive side and the side 22 the negative side of the load 18), the respective one being of a different polarity than is the polarity of the selected one of the amplifier positive side 14 and amplifier return side 16 to which the first open circuited conductor 24 is connected. The second open circuited conductor 30 has a second end 34 which extends towards and terminates free from connection to the amplifier 12.

Generally, both of the open circuited conductors 24 and 30 will comprise wires of at least about 20 gauge (American Wire Gauge - AWG) covered by respective insulated layers 36 having a thickness from about $3 \times 10^{-5}$ meter to about $3 \times 10^{-4}$ meter. It is not necessary that the open circuited conductors 24,30 extend fully or even nearly fully the distance between the amplifier 12 and the load 18. Indeed, it is generally preferred that the open circuited conductors 24,30 extend from about 30% to about 100% of the distance between the amplifier 12 and the load 18. More preferably, the open circuited conductors 24,30 extend from about 50% to about 99% of the distance between the amplifier 12 and the load 18.

First amplifier-load connecting means 38 serve for electrically connecting the amplifier positive side 14 to the load positive side 20, the first connecting means 38 being wound about at least a majority of the length of a selected one of the first and second open circuited conductors 24 and 30. In the embodiment illustrated in FIG. 1 the first amplifier-load connecting means 38, although not shown as such in FIG. 1 (see FIG. 3), is wound about at least a portion and normally a majority of the length of the first open circuited conductor 24. On the other hand, in the embodiment illustrated in FIG. 2, the first amplifier-load connecting means 38 is wound about at least a portion and normally a majority of the length of the second open circuited conductor 30.

Second amplifier-load connecting means 40 serves for electrically connecting the amplifier return side 16 to the load return side 22. The second connecting means 40 is wound about at least a portion and normally a majority of the length of a selected other of the first and second open circuited conductors 24 and 30. In the embodiment illustrated in FIG. 1 the second amplifier-load connecting means 40 is wound about the second open circuited conductor 30. In the embodiment illustrated in FIG. 2 the second amplifier-load connecting means 40 is wound about the first open circuited conductor 24.

In accordance with the present invention electrical insulation is provided between each of the open circuited conductors 24 and 30 and the corresponding amplifier-load connecting means 38 and 40 which is wound thereabout. The insulation creates a pair of gaps between the open circuited conductors 24 and 30 and the corresponding amplifier-load connecting means 38 and 40 with the gaps being from about $1 \times 10^{-4}$ meter to about $1 \times 10^{-3}$ in size. Preferably the gaps are from about $3.8 \times 10^{-4}$ meter to about $4.6 \times 10^{-4}$ meter.

The amplifier-load connecting means 38 and 40 preferably each comprise a plurality of connectors 42 which are wound helically about the open circuited conductors 24 and 30, all as illustrated in FIG. 3. More preferably, each of the connectors 42 includes a central insulating core 44 surrounded by a plurality of wire strands 46 with the strands 46 being encased within an insulating sheath 48 which preferably has a thickness from about $6 \times 10^{-5}$ meter to about $6 \times 10^{-4}$ meter. In this manner the insulating sheath 48 about the strands 46, along with the insulating layers 36 about the open circuited conductors 24 and 30, provide the desired gaps between the open circuited conductors 24,30 and the corresponding amplifier-load connecting means 38,40. FIG. 3 illustrates three of the connectors 42 helically wound about the open circuited conductors 24,30. FIG. 4 illustrates details in the structure of the connectors 42.

As may be seen with reference to FIG. 1, the first end 26 of the first open circuited conductor 24 may be connected to the amplifier positive side 14 with the first amplifier-load connecting means 38 wound about the first open circuited conductor 24 while the first end 32 of the second open circuited connector 30 is connected to the load return side 22 and the second amplifier-load connecting means 40 is wound about the second open circuited conductor 30.

In accordance with another embodiment, also as illustrated in FIG. 1 but now mentally reversing the assumed polarities of the sides 14 and 16 of the amplifier 12 and of the sides 20 and 22 of the load 18, the first end 26 of the first open circuited connector 24 may be connected to the amplifier return side 14 with the first amplifier-load connecting means 38 wound about the first open circuited conductor 24 while the first end 32 of the second open circuited conductor 30 is connected to the load positive side 22 and the second amplifier-load connecting means 40 is wound about the second open circuited conductor 30.

Adverting now to FIG. 2 an embodiment is illustrated wherein the first end 26 of the first open circuited conductor 24 is connected to the amplifier positive side 14 and the second amplifier-load connecting means 40 is wound about the first open circuited conductor 24 while the first end 32 of the second open circuited conductor 30 is connected to the load return side 22 and the first amplifier-load connecting means 38 is wound about the second open circuited conductor 30.

FIG. 2 also illustrates the embodiment wherein the first end 26 of the first open circuited conductor 24 is connected to the amplifier return side 14 with the first amplifier-load connecting means 38 wound about the first open circuited conductor 24 while the first end 32 of the second open circuited conductor 30 is connected to the load positive side 16 with the second amplifier-load connecting means 40 wound about the second open circuited conductor 30. In this latter instance it is assumed that the polarity of the sides 14 and 20 is reversed and the polarity of the sides 20 and 22 is reversed. That is, the side 14 is assumed to be the return side, the side 16 is assumed to be the positive side, the side 20 is assumed to be the return side and the side 22 is assumed to be the positive side.

Industrial Applicability

In accordance with the present invention cabling 10 is provided for interconnecting an amplifier 12 to a load 18, generally a speaker. The particular cabling 10 of the present invention leads to the high frequency and low frequency components of an audio frequency signal (generally in a range from about 20 to 20,000 Hertz) travelling at substantially the same speed. The speaker or load 18 is current driven whereby noticeable sonic improvement results. In essence, distributed capacitance is provided between the open circuited conductors 24 and 30 and the amplifier-load connecting means 38 and 40 thereby leading to the improved sound.

While the invention has been described in connection with certain specific embodiments thereof it will be realized by one of ordinary skill in the art that variations can be made therein without departing from the scope or spirit of the present invention as herein described and as set forth in the appended claims.

I claim:

1. Cabling for interconnecting a source having a positive side and a return side to a load having a positive side and a return side, comprising:
   a first open circuited conductor having a first end connected to a selected one of said source positive side and said source return side and having a second end extending towards and terminating free from connection to said load;
   a second open circuited conductor having a first end connected to a respective one of said load positive side and said load return side, said respective one being of a different polarity than the polarity of said selected one of said source positive side and source return side to which said first open circuited conductor is connected, and having a second end extending towards and terminating free from connection to said source;
   first source-load connecting means for electrically connecting said source positive side to said load positive side, said first connecting means being wound about at least a portion of the length of a selected one of said first and second open circuited conductors; and
   second source-load connecting means for electrically connecting said source return side to said load return side, said second connecting means being wound about at least a portion of the length of a selected other of said first and second open circuited conductors.

2. Cabling as set forth in claim 1, wherein said load comprises a speaker.

3. Cabling as set forth in claim 1, further including:
   electrical insulation between each of said open circuited conductors and the corresponding source-load connecting means wound thereabout.

4. Cabling as set forth in claim 3, wherein said insulation creates a pair of gaps between said open circuited conductors and the corresponding source-load connecting means, said gaps being from about $1 \times 10^{-4}$ meter to about $1 \times 10^{-3}$ meter.

5. Cabling as set forth in claim 4, wherein said gaps are from about $3.8 \times 10^{-4}$ meters to about $4.6 \times 10^{-4}$ meter.

6. Cabling as set forth in claim 1, wherein said open circuited conductors extend from about 30% to about 100% of the distance between said source and said load.

7. Cabling as set forth in claim 1, wherein said open circuited conductors comprise wires of at least about 20 gauge AWG covered by insulating layers having a thickness from about $3 \times 10^{-5}$ meter to about $3 \times 10^{-4}$ meter.

8. Cabling as set forth in claim 1, wherein said source-load connecting means each comprises a plurality of connectors helically wound about said open circuited conductors.

9. Cabling as set forth in claim 8, wherein each of said connectors includes a central insulating core surrounded by a plurality of wire strands, said strands being encased within an insulating sheath having a thickness from about $6 \times 10^{-5}$ meter to about $6 \times 10^{-4}$ meter.

10. Cabling as set forth in claim 1, wherein said first end of said first open circuited conductor is connected to said source positive side, said first end of said second open circuited conductor is connected to said load return side, said first source-load connecting means is wound about said first open circuited conductor and said second source-load connecting means is wound about said second open circuited conductor.

11. Cabling as set forth in claim 1, wherein said first end of said first open circuited conductor is connected to said source return side, said first end of said second open circuited conductor is connected to said load positive side, said first source-load connecting means is wound about said first open circuited conductor and said second source-load connecting means is wound about said second open circuited conductor.

12. Cabling as set forth in claim 1, wherein said first end of said first open circuited conductor is connected to said source positive side, said first end of said second open circuited conductor is connected to said load return side, said first source-load connecting means is wound about said second open circuited conductor and said second source-load connecting means is wound about said first open circuited conductor.

13. Cabling as set forth in claim 1, wherein said first end of said first open circuited conductor is connected to said source return side, said first end of said second open circuited conductor is connected to said load positive side, said first source-load connecting means is wound about said first open circuited conductor and said second source-load connecting means is wound about said second open circuited conductor.

14. Cabling as set forth in claim 2, wherein said source comprises an audio amplifier.

* * * * *